(12) United States Patent
Aratani et al.

(10) Patent No.: US 7,560,724 B2
(45) Date of Patent: Jul. 14, 2009

(54) STORAGE DEVICE WITH REVERSIBLE RESISTANCE CHANGE ELEMENTS

(75) Inventors: Katsuhisa Aratani, Chiba (JP); Tomohito Tsushima, Kanagawa (JP); Hiroaki Narisawa, Tokyo (JP); Wataru Otsuka, Tokyo (JP); Hidenari Hachino, Nagasaki (JP)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 11/632,594

(22) PCT Filed: Jul. 8, 2005

(86) PCT No.: PCT/JP2005/013098

§ 371 (c)(1), (2), (4) Date: Jan. 17, 2007

(87) PCT Pub. No.: WO2006/009090

PCT Pub. Date: Jan. 26, 2006

(65) Prior Publication Data

US 2008/0083918 A1    Apr. 10, 2008

(30) Foreign Application Priority Data

Jul. 22, 2004   (JP)   ............................. 2004-214603

(51) Int. Cl.
*H01L 45/00*   (2006.01)
*G11C 11/00*   (2006.01)

(52) U.S. Cl. ............ 257/5; 257/3; 257/4; 257/E45.002; 365/148; 365/163

(58) Field of Classification Search ...................... 257/3, 257/4, 5, 295, E45.002, E29.17, E27.104
See application file for complete search history.

(56) References Cited

U.S. PATENT DOCUMENTS

| 6,583,003 | B1 | 6/2003 | Hsu et al. | |
| 7,015,494 | B2 * | 3/2006 | Campbell | 257/4 |
| 7,071,485 | B2 * | 7/2006 | Takaura et al. | 257/3 |
| 2003/0234449 | A1 | 12/2003 | Aratani et al. | |
| 2005/0093043 | A1 | 5/2005 | Morita et al. | |

FOREIGN PATENT DOCUMENTS

| EP | 1536474 A2 | 6/2005 |
| JP | 2002-536840 A | 10/2002 |
| JP | 2004-6579 A | 1/2004 |
| JP | 2004-119958 A | 4/2004 |
| JP | 2005-197634 A | 7/2005 |
| WO | WO 00/48196 A1 | 8/2000 |
| WO | WO 2004/100266 A1 | 11/2004 |

* cited by examiner

*Primary Examiner*—Sue Purvis
*Assistant Examiner*—Selim Ahmed
(74) *Attorney, Agent, or Firm*—Wolf, Greenfield & Sacks, P.C.

(57) ABSTRACT

It is intended to provide a storage element having an arrangement which becomes able to be manufactured easily with high density. A storage element includes resistance changing elements 10 having recording layers 2, 3 provided between two electrodes 1, 4 and in which resistance values of the recording layers 2, 3 are reversibly changed with application of electric potential with different polarities to these two electrodes 1, 4, at least part of the layers 2, 3 constructing the recording layers of the resistance changing elements 10 being formed commonly by the same layer in a plurality of adjacent memory cells.

11 Claims, 5 Drawing Sheets

US 7,560,724 B2

STORAGE DEVICE WITH REVERSIBLE RESISTANCE CHANGE ELEMENTS

FIELD OF THE INVENTION

The present invention relates to a storage element in which memory cells are constructed by using resistance changing elements in which a resistance value of a recording film is reversibly changed with application of electric potential with different polarities to two electrodes.

BACKGROUND ART

In formation equipment such as computers, a high-density DRAM which can operate at a high speed is widely used as a random-access memory.

However, the DRAM is complex in manufacturing process as compared with a general logic circuit LSI used in electronic equipment and signal processing and hence its manufacturing cost is high.

Also, the DRAM is a volatile memory of which information is lost when the supply of power is stopped. Hence, refresh operation should be carried out frequently, that is, written information (data) should be read out, amplified again and information should be written again.

For this reason, an FeRAM (ferroelectric substance memory), an MRAM (magnetic storage element) and the like are proposed as a nonvolatile memory of which information can be prevented from being lost even when the supply of power is stopped.

In the case of these memories, without supply of power, it becomes possible to keep written information for a long period of time.

Also, in the case of these memories, it is considered that if these memories are formed as nonvolatile memories, then refresh operations can be removed so that power consumption can be decreased.

However, in the above-mentioned nonvolatile memories, it becomes difficult to maintain characteristics of storage elements as a memory element constructing each memory cell is being reduced in size.

Therefore, it is difficult to reduce the element in size up to the limits of a design rule and the limits to a manufacturing process.

Accordingly, a storage element of a new type is proposed as a memory having an arrangement which is suitable for being reduced in size.

This storage element has a structure in which an ion conductor containing a certain metal is sandwiched between two electrodes.

Then, if any one of the two electrodes contains a metal contained in the ion conductor, then when a voltage is applied to the two electrodes, the metal contained in the electrode is diffused into the ion conductor as ions, whereby electric characteristics such as a resistance value or a capacitance of the ion conductor are changed.

It is possible to construct a memory device by using this characteristic (see Cited Patent Reference 1 and Cited Nonpatent Reference 1, for example).

To be concrete, the ion conductor is a glass material or a semiconductor material made of a solid solution made of chalcogenide and metal. To be more concrete, the ion conductor is made of materials in which Ag, Cu, Zn are dissolved in solid into AsS, GeS, GeSe (for example, chalcogenide glass containing Ag, Cu, Zn like AsSAg, GeSeAg, GeSAg, AsSCu, GeSeCu and GeSCu is suitable). Any one electrode of the two electrodes contains Ag, Cu, Zn (see the above-described Cited Patent Reference 1). It should be noted that the other electrode is formed of tungsten, nickel, molybdenum, platinum, metal silicide and the like which may not be substantially dissolved into materials containing the ion conductor.

Then, for example, the storage element and a diode or a selection element like a MOS transistor may be connected to form a memory cell, and these memory cells can be arrayed to construct a memory device.

In the storage element having this arrangement, when a bias voltage higher than a threshold voltage is applied to the two electrodes, conductive ions (ions such as Ag, Cu, Zn and the like) within the ion conductor are moved to the negative electrode direction to reach a negative electrode, thereby resulting in electrodeposition being generated. Further, when this electrodeposition grows like branches (dendrite), for example, and reaches a positive electrode, a current path is formed so that the resistance value of the ion conductor is changed from high resistance to low resistance. As a result, it is possible to record information on the storage element.

Also, when a voltage of a polarity opposite to that of the above-mentioned bias voltage is applied to the two electrodes, conductive ions which form the branch-like current path are dissolved into the ion conductor, whereby the current path is lost and the resistance value is returned to the initial high resistance state. As a consequence, recorded information can be erased from the storage element.

Also, apart from the above-mentioned arrangement, there is further proposed a storage element having an arrangement in which a barrier layer to limit movements of ions is inserted between the electrode and the ion conductor. It is considered that this barrier layer may be suitably made of a material to limit movements of ions although it allows electrons to be conducted in the inside thereof, for example, titanium nitride, titanium tungsten, nickel oxide and the like. Then, the barrier layer should be sufficiently decreased in thickness (less than 3 nm) in such a manner that electrons may pass the barrier layer at a desired operation voltage.

In the storage element having the arrangement in which the barrier layer is formed as described above, electrons are conducted within the barrier layer with application of a recording voltage higher than a threshold voltage, whereafter electrodeposition is advanced later on and a current path is formed between the surface of the barrier layer and the other electrode, thereby resulting in electric characteristics such as resistance being changed.

Then, a proposed cell structure is a structure in which a via-hole is formed on a part of an insulating layer formed on one electrode (lower electrode), ion conductor/barrier layer/the other electrode (upper electrode) being formed within the via-hole regardless of the existence of the barrier layer.

When the storage element has the above-mentioned structure, it is possible to make a storage element become relatively small in size (for example, in the order of 10 nm), and the storage element can be insulated from other electric constituents by the insulating layer formed on one electrode.

When the arrangement in which the storage element is formed within the via-hole as described above is manufactured, an insulating layer is deposited on the lower electrode, for example. Further, the via-hole which reaches the lower electrode is formed on the insulating layer by patterning and etching process. After that, respective layers from the ion conductor up to the upper electrode are deposited within the via-hole selectively or in a non-selective fashion.

Here, it has been described that, when respective layers are deposited in a non-selective fashion, after the respective layers were deposited, an ion conductor and an electrode film material formed on the insulating layer may be removed by a CMP (chemical mechanical polish) and/or etching technique.

Further, a resistance changing type nonvolatile memory using PCMO (PrCaMnO) as a recording film material has been reported (see Cited Non-patent reference 2).

Then, also in the case of the resistance changing type nonvolatile memory using this PCMO, a proposed cell structure has a PCMO film formed within a via-hole which is patterned by an insulating film.

Meanwhile, in a processing process to form each memory cell and which is used when a semiconductor memory device such as a DRAM is manufactured, it has been customary to use an RIE (reactive ion etching) method which is one of the etching processing methods.

By using the processing technology such as the RIE method, it is possible to easily separate the memory cells electrically and physically.

Then, when all adjacent memory cells or memory cells connected to the same selection line and memory cells connected to the adjacent non-selection line are separated electrically and physically, it is possible to decrease electric mutual interference and it is also possible to prevent unnecessary atom diffusion of impurity atoms.

In particular, since the RIE method is able to place constitutive film elements in the gas phase state by reaction with an etching gas and to remove the vapor constitutive film elements by etching from an ideal standpoint, this reactive ion etching method is free from decrease of a manufacturing yield due to re-deposition of the thus etched constitutive film elements and hence this reactive ion etching method is used widely.

[Cited Patent Reference 1]: Japanese unexamined PCT publication No. 2002-536840

[Cited Non-patent Reference 1]: NIKEEI ELECTRONICS, the issue of 2003, Jan. 20 (page 104)

[Cited Non-patent Reference 2]: Technical Digest, International Electron Devices Meeting (IEDM), 2002, p.193

DISCLOSURE OF THE INVENTION

However, when each layer constructing a storage element is formed within the via-hole, methods such as a selective epitaxial growth using orientation of an underlayer electrode or a film growth based on plating are required in order to selectively deposit respective layers within the via-hole.

Thus, it is not possible to use ordinary film deposition methods (vapor deposition, sputtering, CVD method, etc.).

Further, in any of the aforementioned storage elements of new type, the storage elements are constructed by materials which are inexperienced materials to the related-art semiconductor manufacturing process.

Then, when it is intended to process such novel material by the RIE method, it is difficult to vaporize such novel material depending on constitutive elements or even when such novel material can be vaporized, it is necessary to select reaction gas and to examine optimization of etching conditions and the like.

In particular, when the microfabrication technology is advanced so that processing precision obtained by lithography becomes less than 100 nm and further it becomes less than 50 nm, the etching technology with processing precision as very high as approximately under several nanometers in length is required and hence it is difficult to process such novel materials by the related-art etching technique.

Also, when such novel materials are in use, if it is intended to form respective layers constructing a storage element according to non-selective growth by using the ordinary film deposition method, then a problem concerning a deposited state such as non-uniformity of the film within the via-hole (for example, non-uniformity of film thickness) will arise or it is necessary to examine optimization of conditions in a CMP (chemical mechanical polish) method after film deposition or conditions in a film removing process based on etching technique.

Accordingly, the aforementioned storage element of new type encounters with a problem in which a very long development period becomes necessary in order to improve a manufacturing yield.

Meanwhile, as a method for processing minute shapes in the semiconductor manufacturing process or the like, there are used lithography technologies using deep ultraviolet rays, extreme ultraviolet rays, electron beams and the like.

According to this lithography technology, it is possible to process very minute shape which is less than 100 nm.

Since this lithography technology is difficult to sufficiently increase a focal depth, its processing resolution or precision depends on a wafer plane distribution of exposed surface height.

Then, when the exposed surface is the surface of the semiconductor such as a silicon substrate, the surface of the substrate is polished with high precision and the exposed surface height has sufficient uniformity. For this reason, patterning processing of the gate of a MOS transistor, for example, can be carried out with very high resolution at high precision.

On the other hand, after the silicon substrate was treated by a plurality of processes such as film deposition and etching processing, it is difficult to obtain the exposed surface height distribution of approximately the initial substrate surface due to uneven film thicknesses, unevenness of processed amount such as etching and polishing and difference of processed amounts based on materials required when constructing materials are different depending on the portions.

For this reason, resolution of lithography in the wiring process, for example, is inferior to that of the processing process of the gate of the MOS transistor.

Accordingly, it is difficult for the storage element of new type in which memory cells are constructed by using selection elements, for example, MOS transistors and resistance changing elements to obtain equivalent lithography resolution even by using an exposure light source of the same wavelength as compared with a flash memory or the like in which memory cells can be constructed by using only MOS transistor elements.

As a result, it becomes difficult to manufacture a memory device formed of arrays of memory cells at high density.

In order to solve the above-mentioned problems, the present invention intends to provide a storage element having an arrangement which can be easily manufactured at high density.

A storage element according to the present invention is characterized in that resistance changing elements having recording layers provided between two electrodes and in which resistance values of the recording layers are reversibly changed with application of electric potential with different polarities to the two electrodes construct memory cells, at least part of the layers constructing the recording layers of the resistance changing elements being formed commonly by the same layer in a plurality of adjacent memory cells.

According to the above-mentioned arrangement of the storage element of the present invention, since the respective memory cells are constructed by the resistance changing elements in which the recording layers are provided between the two electrodes and in which the resistance values of the recording layers are reversibly changed with application of electric potential with different polarities to the two electrodes, the resistance value of the resistance changing element can be reversibly changed between high resistance and low resistance. Hence, the resistance state of the resistance changing element can be stored in the memory cell as information.

Also, since at least part of layers constructing the recording layers of the resistance changing element may be formed by the same layer in a plurality of adjacent memory cells, when the storage element is manufactured, the commonly formed layer need not be treated by local deposition of recording film or patterning processing at every memory cell. Hence, patterning precision can be lowered and it becomes possible to easily carry out the patterning.

Also, in the above-described storage element according to the present invention, it is possible to construct a storage element having an arrangement in which resistance changing elements are formed above the wiring to apply an operation voltage to the resistance changing element.

According to the above-mentioned arrangement, since very thin wirings necessary to drive the storage element are formed before the resistance changing elements are formed, a high temperature (for example, temperature higher than 350° C.) process necessary for forming an insulating film between the wiring layers need not be carried out after the recording films, for example, of the resistance changing element were deposited. It becomes possible to form the resistance changing element by using even materials in which a film structure is changed under high temperature.

According to the above-mentioned present invention, when the storage element is manufactured, since patterning precision with respect to the commonly formed layers can be lowered and patterning can be carried out easily, it is possible to considerably improve a manufacturing yield.

Accordingly, even when the size of the memory cell is microminiaturized, since the storage element can be easily manufactured with a high yield, it becomes possible to increase density of a memory cell. As a result, it becomes possible to increase a storage capacity of a storage element and to miniaturize a memory.

Also, even when novel materials (elements and compositions) which are inexperienced materials of the related-art semiconductor process are used for electrodes and recording layers, since storage elements can be easily manufactured with a high yield, it becomes possible to considerably reduce a period of time required to develop the processing technology.

Further, even when novel materials are used in the recording layers and the like, since inexpensive old-type lithography systems and manufacturing processes can cope with such novel materials, it becomes possible to considerably decrease a manufacturing cost of the storage element.

Then, since factors to determine density of the memory cell and the manufacturing yield of the storage element are determined by material/lithography process/etching process/ polishing process which are not related to the arrangement of the resistance changing element but which are available in the related-art semiconductor mass-production technology, the related-art technologies can be easily applied to the present invention.

Further, when the storage element has the arrangement in which the resistance changing element is formed above the wiring to apply the operation voltage to the resistance changing element, since it becomes possible to use even the material in which the film structure is changed under a high temperature for the resistance changing element, it is possible to increase freedom to select materials of the resistance changing element.

Accordingly, it becomes possible to use materials of which characteristics such as resistance changing ratio are excellent and inexpensive materials for the resistance changing element. As a consequence, it becomes possible to easily discriminate information recorded on the memory cells of the storage element and to make the storage element inexpensive or to decrease a manufacturing cost.

BEST MODE FOR CARRYING OUT THE INVENTION

Figure 1:
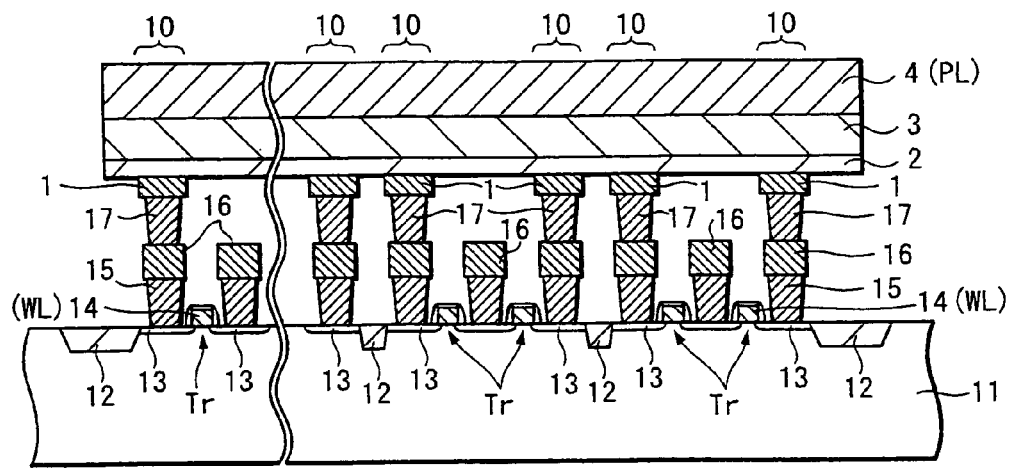
FIG. 1 is a schematic arrangement diagram (cross-sectional view) of a storage element according to an embodiment of the present invention.

FIG. 1 is a schematic arrangement diagram (cross-sectional view) of a storage element according to an embodiment of the present invention.

This memory cell is composed of an array of a large number of resistance changing elements 10 which configure memory cells.

The resistance changing element 10 includes a high resistance film 2 and an ion source layer 3 sandwiched between a lower electrode 1 and an upper electrode 4. These high resistance layer 2 and ion source layer 3 constitute a recording layer by which information can be recorded on the resistance changing element 10 of each memory cell as will be described later on.

The ion source layer 3 contains more than one kind of elements (metal elements) selected from Ag, Cu, Zn and more than one kind of elements (chalcogenide elements) selected from S, Se, Te.

Then, when the metal element is ionized as will be described later on, a resistance value of the resistance changing element 10 is changed. That is, this metal element (Ag, Cu, Zn) becomes an ion source.

The high resistance film 2 is constructed by using a material with resistivity higher than that of the ion source layer 3, for example, an insulator or a semiconductor.

To be concrete, it is possible to use as silicon oxide, silicon nitride, rare earth oxide film, rare earth nitride film, amorphous silicon and amorphous germanium. Further, it is possible to use materials such as amorphous chalcogenide.

To be concrete, a CuTeGeGd film, for example, can be used as the above-mentioned ion source layer 3. Although this CuTeGeGd film may change its resistivity based on composition, since Cu, Te and Gd are the metal elements, it is easier to lower resistance as compared with the case in which S or Se is used at least as chalcogenide.

In the amorphous chalcogenide thin film, GeTe has very low resistivity and its resistivity is approximately $1\times10^4$ $\Omega$cm. On the other hand, GeSe has resistivity of approximately $1\times10^{13}$ $\Omega$cm and GeSTe has resistivity of approximately $1\times10^{11}$ $\Omega$cm (see page 76 of the May issue of "FUNCTIONAL MATERIAL", 1990).

In this manner, it is possible to lower resistance by containing metal such as Cu and Cd into a material using a GeTe as a host material or a material containing Te. Then, a resistance value of a CuTeGeGd film having a thickness of 20 nm and a cell area of 0.4 $\mu m^2$ can be decreased to be less than approximately $100\Omega$.

On the other hand, a resistance value of a-gadolinium oxide film for use with the high resistance film 2 can be easily increased to be higher than 100 k$\Omega$ and further increased to be 1 M$\Omega$ even though it has a relatively thin film thickness.

Also, in the arrangement shown in FIG. 1, the respective resistance changing elements 10 are formed above MOS transistors Tr formed on a semiconductor substrate 11.

This MOS transistor Tr is composed of a source/drain region 13 formed on the area separated by an element separating layer 12 within the semiconductor substrate 11 and a gate electrode 14. A side wall insulating layer is formed on the wall surface of the gate electrode 14.

Also, the gate electrode 14 is commonly used as the word line WL which is one address wiring of the storage element.

Then, one of the source/drain region 13 of the MOS transistor Tr and the lower electrode 1 of the resistance changing element 10 are electrically connected to each other through a plug layer 15/metal wiring layer 16/plug layer 17.

The other of the source/drain region 13 of the MOS transistor Tr is connected through the plug layer 15 to the metal wiring layer 16. This metal wiring layer 16 is connected to a bit line BL (see FIG. 2) which serves as the other address wiring of the storage element.

In this embodiment, in particular, over the whole of the memory cell array portion (memory portion), the resistance changing element 10 that configures each memory cell may have respective layers of the high resistance film 2/ion source layer 3/upper electrode 4 in common. In other words, each resistance changing element 10 is composed of the high resistance film 2/ion source layer 3/upper electrode 4 of the same layer.

Then, the upper electrode 4 commonly formed may serve as a plate electrode PL which will be described later on.

On the other hand, the lower electrodes 1 are separately formed at every memory cell and the respective memory cells are separated from each other electrically. By the lower electrodes 1 separately formed at every memory cell, the resistance changing elements 10 of the respective memory cells are provided at the positions corresponding to the respective lower electrodes 1.

Also, the lower electrodes 1 are respectively connected to the corresponding selection MOS transistors Tr.

Figure 2:
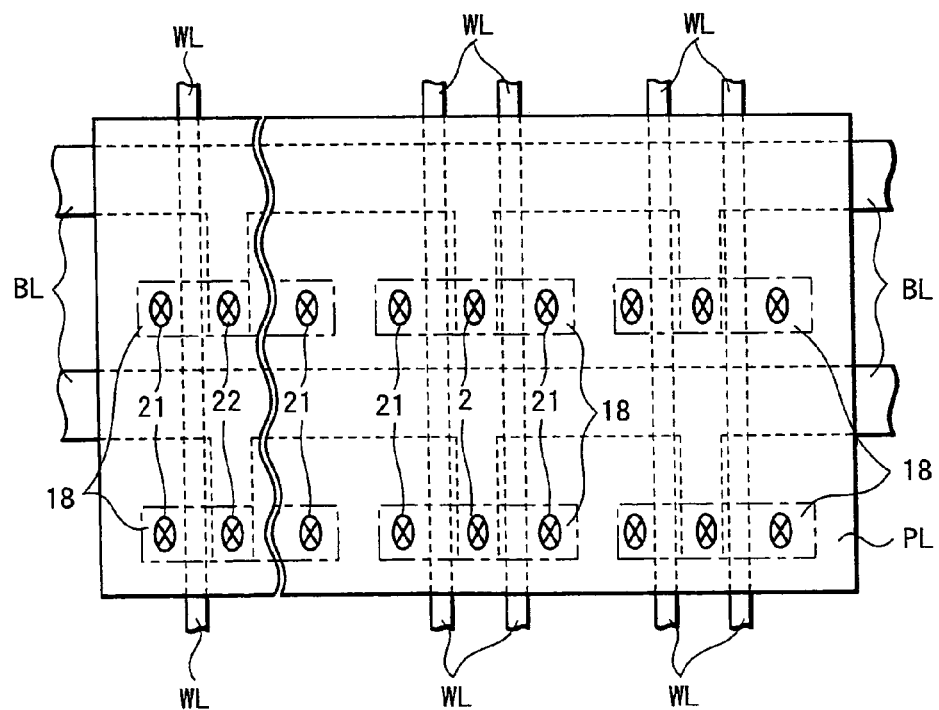
FIG. 2 is a schematic plan view of the storage element of FIG. 1.
Figure 3:
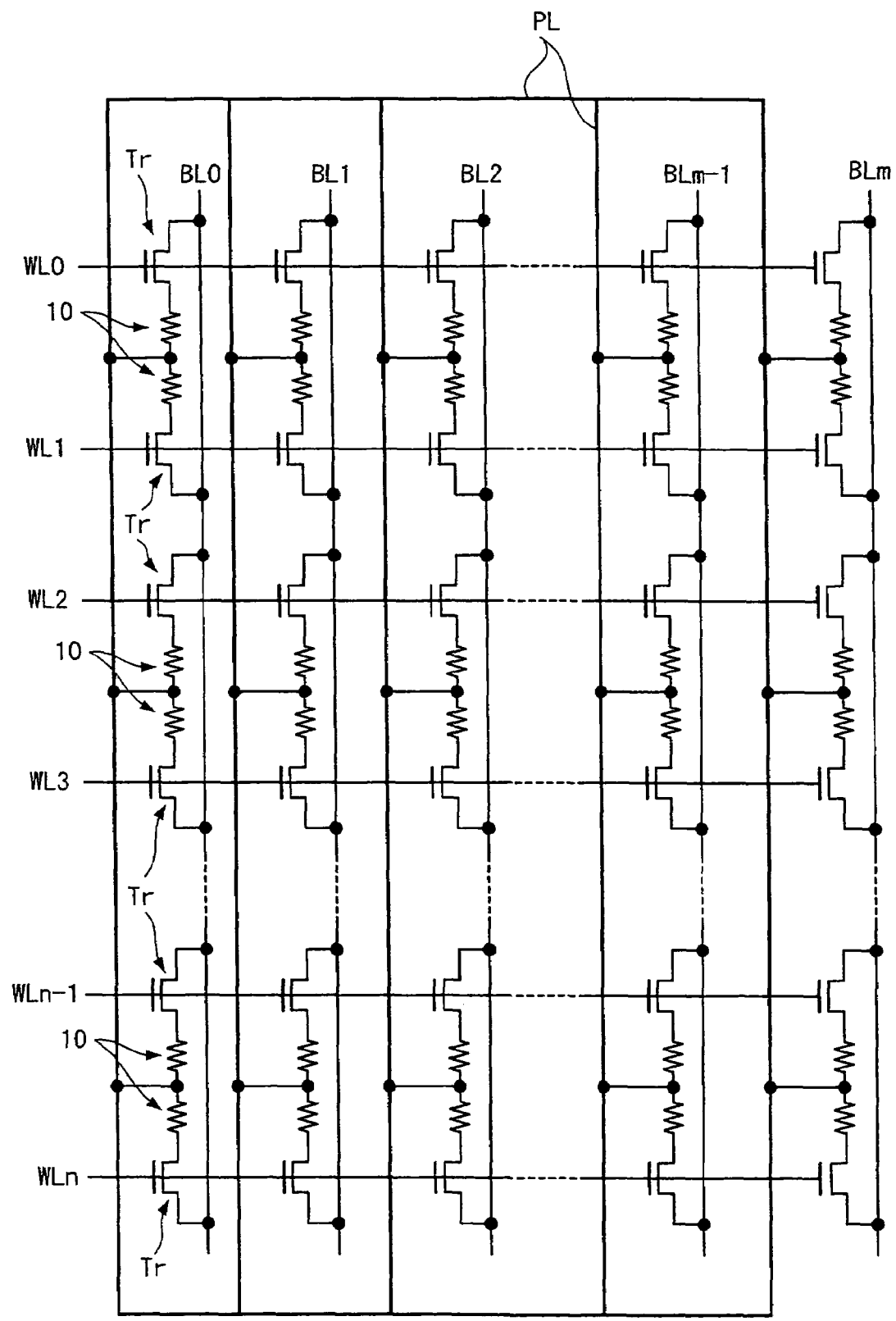
FIG. 3 is an equivalent circuit diagram of the storage element of FIG. 1.

FIG. 2 shows a schematic plan view of the storage element according to this embodiment and FIG. 3 shows an equivalent circuit diagram.

In FIG. 2, a chain line shows an active region 18 of the MOS transistor Tr. Also, in this figure, reference numeral 21 denotes a contact portion which communicates with the lower electrode 1 of the resistance changing element 10 and reference numeral 22 denotes a contact portion which communicates with the bit line BL.

As shown in FIG. 2, the plate electrode PL is formed over the memory cell array portion (memory portion). This plate electrode PL is shown by a bald line in the equivalent circuit diagram of FIG. 3.

Also, as shown in FIG. 3, one end of the resistance changing element 10 is connected to one of the source/drain of the selection MOS transistor Tr, the other of the source/drain of the MOS transistor Tr is connected to the bit line BL (BL0, BL1, . . . , BLm) and the gate of the MOS transistor Tr is connected to a word line WL (WL0, WL1, . . . , WLn).

Then, the other end of the resistance changing element 10 is connected to the plate electrode PL which is commonly formed over the whole of the memory cell array. The same electric potential is applied to each resistance changing element 10 through this plate electrode PL.

Subsequently, operations of the storage element according to this embodiment will be described with reference to FIGS. 1 to 3.

When the gate of the selection MOS transistor Tr is turned ON by the word line WL to apply a voltage to the bit line BL, a voltage is applied to the lower electrode 1 of the selected memory cell through the source/drain of the MOS transistor Tr.

Here, when the polarity of the voltage applied to the lower electrode 1 is held at a negative electric potential as compared with the electric potential of the upper electrode 4 (plate electrode PL), metal elements (for example, Cu), which serve as the ion sources, contained in the ion source layer 3, are moved toward the direction of the lower electrode 1 as ions. When these ions are implanted into the high resistance film 2 or they are deposited on the surface of the high resistance film 2, the interfacial state of the high resistance film 2 is changed so that a resistance value of the resistance changing element 10 is changed to the low resistance state. As a result, information can be recorded on the resistance changing element 10 of the selected memory cell.

Also, when the polarity of the voltage applied to the lower electrode 1 is held at a positive electric potential as compared with the electric potential of the upper electrode 4 (plate electrode PL), with application of the voltage, ions moved into the high resistance film 2 or ions moved to the surface of the high resistance film 2 are moved toward the direction of the upper electrode 4 (plate electrode PL) so that the resistance value of the resistance changing element 10 is again changed to the high resistance state. As a consequence, recorded information can be erased from the resistance changing element 10 of the selected memory cell.

Here, the change of the resistance value of the resistance changing element 10 is mainly caused by the change of the resistance value of the high resistance film 2.

Then, it becomes possible to suppress interference between the adjacent memory cells by decreasing a film thickness of the high resistance film 2 to approximately several nanometers, for example.

It should be noted that the high resistance film 2 may have at least a difference between resistance values of the high resistance state and the low resistance state to an extent that a read signal can be maintained sufficiently. For example, the high resistance film should have a difference larger than 30%.

Also, when recorded information is read out from the memory cell, a memory cell is selected by the MOS transistor Tr, for example, a predetermined voltage or current is applied to the selected memory cell and a current or voltage which differs depending on the resistance state of the resistance changing element 10 is detected by a sense amplifier connected to the portion ahead of the bit line BL or the plate electrode PL.

At that time, a voltage or current applied to the selected memory cell should be selected to be smaller than a threshold value of a voltage or current at which the state of the resistance value of the resistance changing element 10 is changed.

Subsequently, a method of manufacturing a storage element according to this embodiment will be described.

The storage element according to this embodiment can be manufactured as follows, for example.

First, the MOS transistor Tr is formed on the semiconductor substrate 11.

After that, an insulating layer is formed over the surface.

Next, via-holes are formed on this insulating layer.

Subsequently, the insides of the via-holes are filled with an electrode material such as W, WN and TiW by a suitable method such as a CVD method and plating.

Next, the surface is planarized by a suitable method such as a CMP method.

Then, the plug layer 15/metal wiring layer 16/plug layer 17/lower electrode 1 can be formed by repeating these processes and the lower electrode 1 can be processed by patterning at every memory cell.

Subsequently, an insulating film or a semiconductor film which becomes the high resistance film 2 is deposited on the whole surface of the lower electrodes 1 separated at every memory cell.

It should be noted at that time that it is desired that the surface of the lower electrode 1 should be flushed with the surrounding insulating layer and planarized.

A gadolinium oxide film having a thickness of 4 nm is deposited as the high resistance film 2, for example. This gadolinium oxide film can be formed by thermal oxidation or by a suitable method such as plasma oxidation in the atmosphere of plasma containing oxygen after a metal gadolinium film was deposited.

Alternatively, a rare earth oxide film, a rare earth nitride film, a silicon nitride film and a silicon oxide film can be deposited as the high resistance film 2, for example. These films can be formed by a suitable method such as a so-called reactive sputtering method and a CVD method.

Next, the ion source layer 3 is sequentially deposited on the whole surface of the high resistance film 2. For example, a CuTeGeGd film having a thickness of 20 nm is deposited as the ion source layer 3. Although the CuTeGeGd is a material with low resistance so that it can be directly used as the upper electrode 4, it is desirable that the upper electrode 4 should be made of a material with lower resistance.

Further, the upper electrode 4 is sequentially deposited on the whole surface of the ion source layer 3. For example, a metal material with resistance lower than that of the ion source layer 3, silicide and low resistance nitrides such as TaN and Wn are deposited as the upper electrode 4.

After that, the high resistance film 2/ion source layer 3/upper electrode 4 deposited on the whole surface are processed by patterning such that they may be left on the whole of the memory cell array portion (memory portion).

At that time, it is not necessary to use the forefront microfabrication technology in order to process the high resistance film/ion source layer/upper electrode as the pattern over the whole of the memory cell array portion (memory portion).

Meanwhile, when the layer which constructs the resistance changing element is commonly formed by the adjacent memory cells like this embodiment, the respective resistance changing elements should be formed in such a manner that the adjacent memory cells may be operated independently and correctly.

In particular, when the memory cell is microminiaturized and a distance between the electrodes of the adjacent memory cells is decreased considerably, it is unavoidable that a memory will malfunction due to interference caused between the adjacent memory cells.

Figure 8:
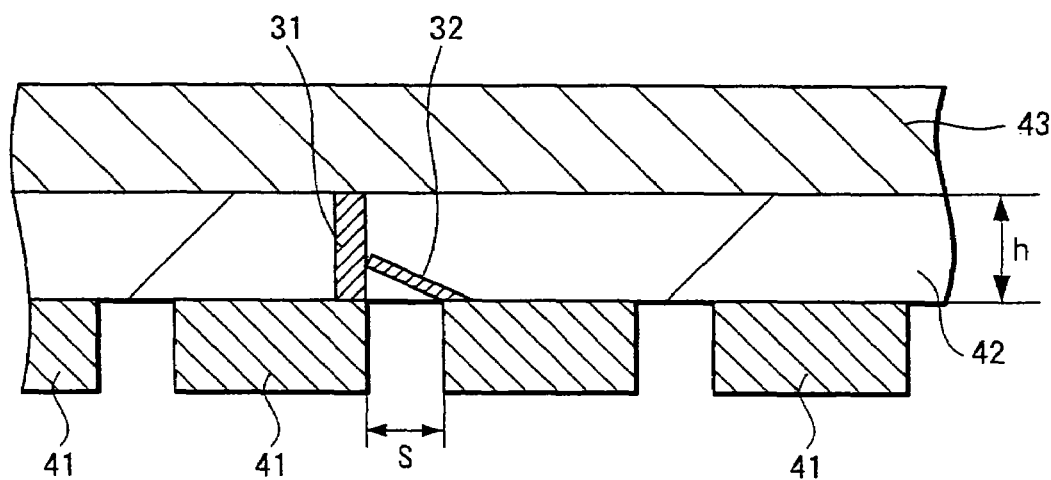
FIG. 8 is a diagram to which reference will be made in explaining malfunctioning in the adjacent memory cells.

For example, as shown in FIG. 8, let us consider an arrangement including lower electrodes 41 formed at every memory cell, a recording layer (portion of which resistance is changed by recording) 42 and an upper electrode 43 formed commonly to a plurality of memory cells.

Then, in one memory cell at the left-hand side in FIG. 8, let it be assumed that a current path (formed by dendrite or ion diffusion and the like) 31 extending vertically within the recording layer 42 is formed from the lower electrode 41 to the upper electrode 43 so that a resistance value of the recording layer 42 of this memory cell is set to the low resistance state.

Here, if a film thickness h of the recording layer 42 is equal to or larger than a distance s between the lower electrodes 41 of the adjacent memory cells (h>s), then the lower electrode 41 of the right adjacent memory cell become closer to the current path 31 formed on the left adjacent memory cell as compared with the common upper electrode 43. Thus, when information is stored in this memory cell, as shown in FIG. 8, there is formed a current path 32 which is extended from the lower electrode 41 to the current path 31 of the adjacent memory cell.

Even in this state, no problem arises when information is read out from the memory cell immediately after information was stored in the memory cell. However, a problem arises when information is erased from the memory cell later on.

Specifically, when information is erased from the left memory cell which is set to the state shown in FIG. 8, the current path 31 of the left memory cell is lost. At that time, although the current path 32 formed on the right adjacent memory cell remains, this current path 32 is not connected to the common upper electrode 43 with the result that the right adjacent memory cell also is changed to the state in which information is erased from this memory cell. As a result, so-called mis-erasure occurs.

Also, since the state in which the current path 32 is formed as shown in FIG. 8 differs from the state in which the current path that reaches the upper common electrode 43 is formed, problems arise not only in the erasure operation but also in the recording operation. As a result, recording operation conditions (for example, operation voltage and so on) are affected and the recording operation becomes unstable.

In order to avoid these problems, it is important to decrease the film thickness of the recording layer (portion of which resistance is changed) sufficiently.

In this connection, in the resistance changing element described in the above-described Cited Patent Reference 1, the portion in which resistance is changed (ion conductive layer) has a film thickness of 35 nm.

For this reason, if the distance between the lower electrodes of the adjacent memory cells becomes less than 50 nm, in particular, 32 nm, then the above-described situation expressed as h>s is established and hence it becomes difficult to construct the storage element of the present invention by using the resistance changing element described in the Cited Patent Reference 1.

Accordingly, in the embodiment shown in FIGS. 1 to 3, when a film thickness of the high resistance film 2 is assumed to be H1 and a distance between the lower electrodes 1 of the adjacent memory cells is assumed to be S1, an inequality of H1<S1 should be satisfied. It is desirable that an inequality of H1<2S1 should be satisfied, and it is more desirable that an inequality of H1<4S1 should be satisfied.

These conditions are those ones under which a current path can be formed in the range in which adjacent cells may not be affected even when an inequality of Vw>2Vth or Vw >4Vth is satisfied between a recording current Vw and a threshold voltage Vth in which the current path is formed, for example.

Also, it is desirable that a resistance value R1 of the ion source layer 3 should be lower than a resistance value Re of the resistance changing element 10 which is set to the erasing state (R1<Re) . It is more desirable that an inequality of R1<4Re should be satisfied.

According to the above-mentioned arrangement of the storage element of this embodiment, since the high resistance film 2/ion source layer 3/upper electrode 4 of the resistance changing element 10 is commonly formed over the whole of the memory cell array portion, it is sufficient that the respective layers of the high resistance film 2/ion source layer 3/upper electrode 4 may be processed so as to remain over the whole of the memory cell array portion in the process in which the respective layers of these high resistance film/ion source layer/upper electrode are processed by patterning when the storage element is manufactured, it is not necessary to use the forefront microfabrication technology.

Consequently, since the underlayer surfaces of the respective layers 2, 3, 4 need not be formed as the surfaces with high flatness like the surface of the semiconductor substrate and the respective layers 2, 3, 4 can be easily processed and patterned by a related-art manufacturing technology, it is possible to easily manufacture storage elements with a high yield.

Accordingly, even when the size of the memory cell is microminiaturized, since storage elements can be easily manufactured with a high yield, it becomes possible to increase density of the memory cell. Thus, it becomes possible to increase a storage capacity of a storage element and to miniaturize a memory.

Also, even when novel materials which are inexperienced materials in the related-art semiconductor process are in use, since it becomes possible to manufacture storage elements with a high yield, it is possible to considerably reduce a period of time required to develop a processing technology.

Further, even when the novel materials are in use, since inexpensive old-type lithography systems and manufacturing process are able to cope with the above-mentioned novel materials, it becomes possible to considerably reduce a manufacturing cost of a storage element.

Then, since factors to determine density of the memory cell and a yield at which a storage element is manufactured are not related to the arrangement of the resistance changing element but the above factors are determined based on materials/lithography process/etching process/polishing process which are available in related-art semiconductor mass-production technologies, related-art technologies can be easily applied to the present invention.

Further, according to the storage element of this embodiment, since the resistance changing element 10 is located above the word line WL (gate 14) and the bit line BL (metal wiring layer 16) which serve as address wirings, a high temperature (for example, about 350° C.) manufacturing process which becomes necessary to form the insulating layer between the wiring layers is not required after the respective layers 2, 3, 4 of the resistance changing element 10 were deposited.

Accordingly, it becomes possible to form the resistance changing element 10 by using materials of which film structures and the like are changed under a high temperature.

Figure 4:
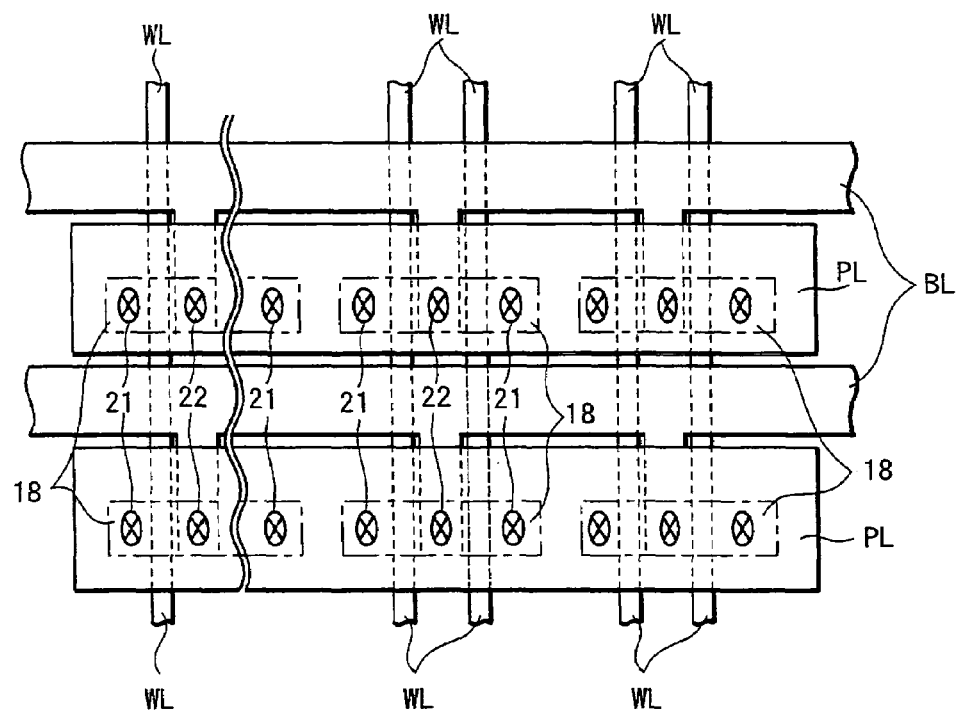
FIG. 4 is a schematic arrangement diagram (schematic plan view) of a storage element according to other embodiment of the present invention.

Next, FIG. 4 shows a schematic arrangement diagram (schematic plan view) of a storage element according to other embodiment of the present invention.

In this embodiment, as shown in FIG. 4, a storage element has an arrangement in which the plate electrode PL is formed commonly to memory cells adjacent to the direction parallel to the bit line BL.

It should be noted that, in the storage element according to this embodiment, a cross-sectional view in the right and left direction of the memory cell has the arrangement shown in FIG. 1 similarly to the preceding embodiment.

Specifically, the high resistance film 2/ion source layer 3/upper electrode 4 are formed commonly in each resistance changing element 10 of the memory cells adjacent to the direction parallel to the bit line BL.

According to the arrangement of this embodiment, since the high resistance film 2/ion source layer 3/upper electrode 4 are commonly formed in the memory cells adjacent to the direction parallel to the bit line BL, as compared with the arrangement in which the respective layers 2, 3, 4 are formed by patterning at every memory cell, required patterning precision in the direction parallel to the bit line BL can be lowered.

As a result, it becomes possible to easily manufacture storage elements with a high yield.

Since it is customary that pitches of a memory cell such as a memory cell of a semiconductor memory are different in the row direction and the column direction, it may be considered that pitches of a memory cell in the storage element using the resistance changing element are different in the row direction and the column direction.

In such a case, since processing precision is different in the row direction and the column direction, it is more effective to moderate patterning precision to easily manufacture storage elements with a high yield by forming respective layers commonly in the direction in which processing precision, in particular, is high.

Then, with respect to the direction in which processing precision is low, so long as processing precision is such one that can be coped with the related-art technology, no problem arises unless respective layers are not formed commonly (if respective layers are separately processed by patterning).

Accordingly, the arrangement of this embodiment is particularly suitable for the case in which a pitch of a memory cell in the direction parallel to the bit line BL is smaller than that of a memory cell in the direction vertical to the bit line BL.

Figure 5:
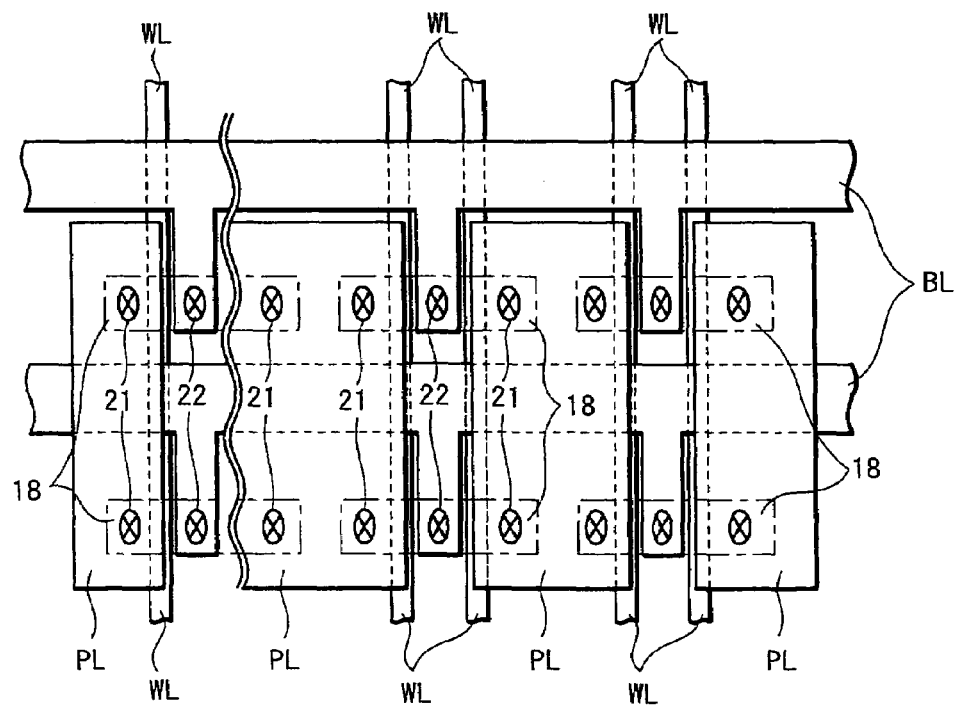
FIG. 5 is a schematic arrangement diagram (schematic plan view) of a storage element according to a further embodiment of the present invention.

Next, FIG. 5 shows a schematic arrangement diagram (schematic plan view) of a storage element according to a further embodiment of the present invention.

In this embodiment, as shown in FIG. 5, the plate electrode PL is formed commonly on four memory cells in total of adjacent two memory cells in the vertical and horizontal directions.

Figure 6:
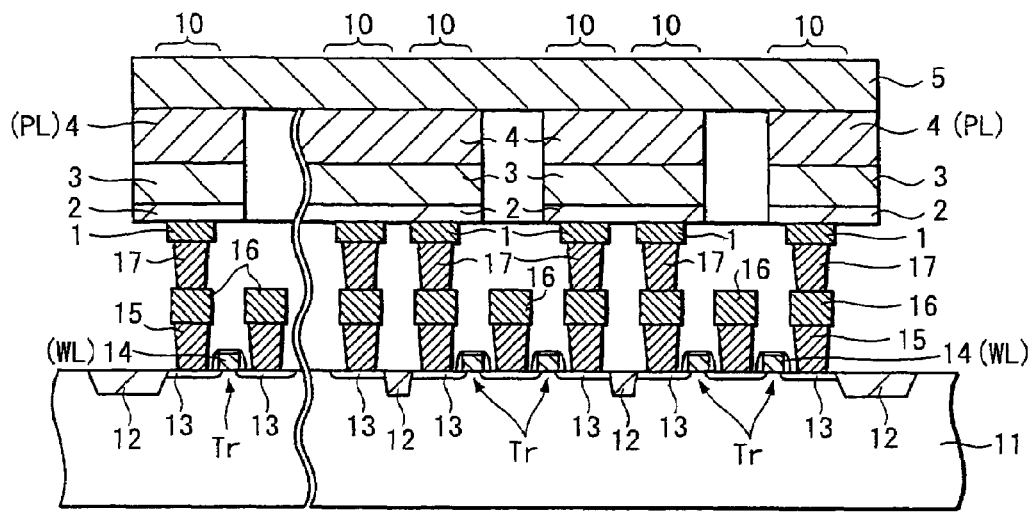
FIG. 6 is a cross-sectional view of the storage element of FIG. 5.

Then, FIG. 6 shows a cross-sectional view of the right and left direction of the memory cell.

More specifically, this embodiment has a constitution in which the high resistance film 2/the ion source layer 3/the upper electrode 4 are commonly formed in the resistance changing elements 10 of the four memory cells neighboring vertically and horizontally.

Also, as shown in FIG. 6, a wiring 5 that extends in the right and left direction in the figure is formed on the upper electrodes 4 which serve as the plate electrodes PL, whereby the same electric potential can be applied through the wiring 5 to the respective plate electrodes PL.

According to the arrangement of this embodiment, since the high resistance film 2/ion source layer 3/upper electrode 4 of four memory cells adjacent in the vertical and horizontal directions are formed commonly, as compared with the arrangement in which these respective layers 2, 3, 4 are patterned at every memory cell, patterning precision of both of the vertical and horizontal directions can be lowered.

As a result, it becomes possible to easily manufacture storage elements with a high yield.

Figure 7:
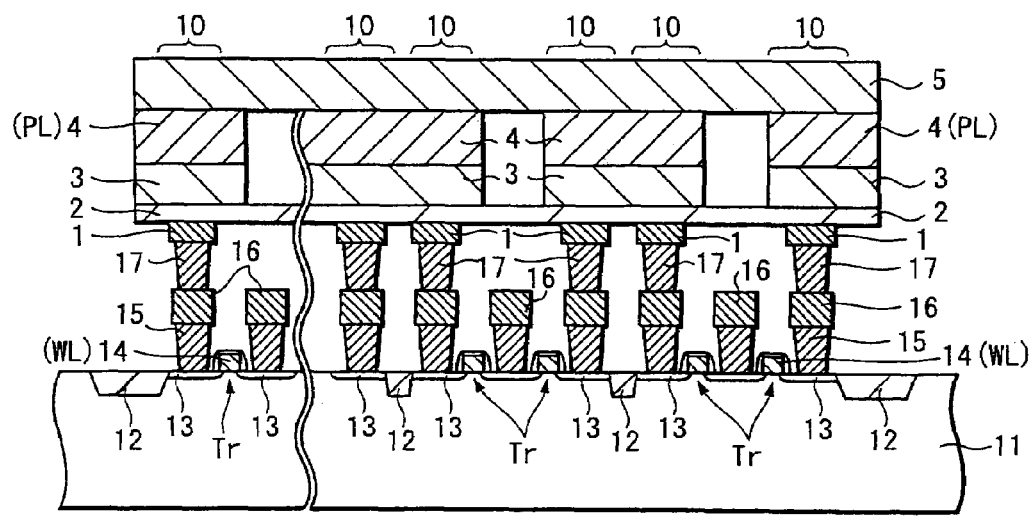
FIG. 7 is a cross-sectional view showing an arrangement of a modified arrangement of FIG. 6.

It should be noted that, as shown in a cross-sectional view of FIG. 7, the arrangement shown in FIG. 6 should be modified in such a manner that only the high resistance film 3 may be patterned in a wider range (for example, the whole of the memory array cell)

Also, according to the present invention, the lower electrode may be commonly formed by adjacent memory cells and the upper electrode may be separated at every memory cell.

At least one of two electrodes that sandwich the recording layer of the resistance changing element may be separated at every memory cell.

In the present invention, it should be noted that the range in which adjacent memory cell layers are formed commonly is not limited to the arrangements shown in the above-mentioned embodiments and that other arrangements also can be used.

Also, in the present invention, the layers commonly formed by the adjacent memory cells are not limited to the arrangements shown in the above-mentioned embodiments and various arrangements such as an arrangement in which only high resistance films are formed commonly and an arrangement in which the high resistance film and the ion source layer are formed commonly but the upper electrode is formed independently can be applied.

Further, instead of the laminated layer structure of the high resistance film and the ion source layer, it is possible to construct one recording layer of which function may serve also as functions of these two layers as well.

Furthermore, the respective layers constructing the resistance changing element can be laminated in the sequential order opposite to those of the above-mentioned respective embodiments.

In a plurality of memory cells adjacent to each other at least in one direction of the vertical and horizontal directions, if at least a part of layer constructing the recording layer of the resistance changing element is formed commonly, then processing precision can be lowered more than that of the arrangement in which respective layers are formed at every memory cell and it becomes possible to easily manufacture storage elements with a high yield.

The present invention is not limited to the above-mentioned embodiments and the present invention can take various other arrangements without departing from the gist of the present invention.

The invention claimed is:

1. A storage element comprising:
memory cells comprising resistance changing elements, wherein said resistance changing elements have recording layers provided between two electrodes;
wherein resistance values of said recording layers are reversibly changed with application of electric potential with different polarities to said two electrodes; wherein at least part of a layer constructing said recording layers of the resistance changing elements is formed commonly with the same layer in at least one adjacent memory cell; and
wherein said recording layers have a laminated layer structure comprising an ion source layer, wherein the ion source layer comprises at least one element selected from a group consisting of Ag, Cu, and Zn and at least one element selected from a group consisting of S, Se, and Te and a high resistance layer formed of an insulator or a semiconductor.

2. The storage element according to claim 1, wherein said resistance changing elements are formed above wires which apply an operation voltage to said resistance changing elements.

3. The storage element according to claim 1, wherein, upon application of a voltage across the two electrodes, a current path is formed in the recording layer of at least one of the resistance changing elements.

4. The storage element according to claim 3, wherein the current path is formed by conductive ions moving from the ion source layer in a direction of a negative electrode.

5. The storage element according to claim 4, wherein the conductive ions comprise at least one element selected from the group consisting of Ag, Cu, and Zn.

6. The storage element according to claim 4, wherein the conductive ions are implanted into the high resistance layer, or deposited on the surface of the high resistance layer.

7. The storage element according to claim 3, wherein the at least one of the resistance changing elements changes from a high resistance state to a low resistance state due to formation of the current path.

8. The storage element of claim 7, wherein the high resistance state has a first resistance value and the low resistance state have a second resistance value, and wherein the first resistance value is at least 130% of the second resistance value.

9. The storage element of claim 7, wherein the high resistance state has a first resistance value and the low resistance state have a second resistance value, and wherein the second resistance value is at most 70% of the first resistance value.

10. The storage element according to claim 1, wherein the high resistance layer comprises one or more of silicon oxide, silicon nitride, rare earth oxide film, rare earth nitride film, amorphous silicon, and amorphous germanium.

11. The storage element according to claim 1, wherein:
the resistance changing elements comprises a first resistance changing element and a second resistance changing element adjacent to the first resistance changing element;
the first resistance changing element is in electrical connection with a first upper electrode and a first lower electrode;
the second resistance changing element is in electrical connection with a second upper electrode and a second lower electrode;
wherein a thickness of the high resistance layer is smaller than a distance between the first and second lower electrodes.

* * * * *